United States Patent
Nguyen et al.

(10) Patent No.: US 7,487,379 B2
(45) Date of Patent: Feb. 3, 2009

(54) HIGH PERFORMANCE INTEGRATED CIRCUIT WITH LOW SKEW CLOCKING NETWORKS AND IMPROVED LOW POWER OPERATING MODE HAVING REDUCED RECOVERY TIME

(75) Inventors: Hai N. Nguyen, Redwood City, CA (US); Raymond Pinkham, Los Gatos, CA (US); Yuanping Chen, Austin, TX (US)

(73) Assignee: RMI Corporation, Cupertino, CA (US)

( * ) Notice: Subject to any disclaimer, the term of this patent is extended or adjusted under 35 U.S.C. 154(b) by 456 days.

(21) Appl. No.: 11/283,154

(22) Filed: Nov. 18, 2005

(65) Prior Publication Data

US 2006/0109943 A1 May 25, 2006

Related U.S. Application Data

(60) Provisional application No. 60/630,527, filed on Nov. 22, 2004.

(51) Int. Cl.
*G06F 1/04* (2006.01)
*G06F 1/12* (2006.01)
*H03D 3/24* (2006.01)

(52) U.S. Cl. ............... 713/600; 713/400; 375/376
(58) Field of Classification Search ........... 713/600, 713/400
See application file for complete search history.

(56) References Cited

U.S. PATENT DOCUMENTS

| | | | | |
|---|---|---|---|---|
| 5,369,376 A | * | 11/1994 | Leblebicioglu | 331/8 |
| 6,240,152 B1 | * | 5/2001 | Ho | 375/376 |
| 6,651,231 B2 | * | 11/2003 | Morikawa | 716/6 |
| 6,909,312 B2 | * | 6/2005 | Mitsumoto | 327/141 |
| 7,130,368 B1 | * | 10/2006 | Aweya et al. | 375/376 |

* cited by examiner

*Primary Examiner*—Suresh K Suryawanshi
(74) *Attorney, Agent, or Firm*—Zilka-Kotab, PC

(57) ABSTRACT

An integrated circuit includes a phase-locked-loop with fast clock synchronization recovery. A phase frequency detector is configured to receive a system clock signal and a feedback clock signal and to generate a comparison signal. A clock generator is configured to general a first clock signal based on the comparison signal, and an internal clock signal. A controller coupled to the clock generator and configured to deliver a mesh clock signal to a global clock mesh. A synchronizer coupled to the control logic and configured to generate a feedback clock signal to the phase frequency detector. The mesh clock signal is provided from the global clock mesh to the synchronizer. Advantages of the invention include the ability to operate the integrated circuit in a sleep state with a slow clock rate and then quickly recover to an operational clock rate.

18 Claims, 7 Drawing Sheets

HIGH PERFORMANCE INTEGRATED CIRCUIT WITH LOW SKEW CLOCKING NETWORKS AND IMPROVED LOW POWER OPERATING MODE HAVING REDUCED RECOVERY TIME

RELATED APPLICATIONS

This application claims priority to Prov. No. 60/630,527 filed Nov. 22, 2004, incorporated herein by reference.

FIELD

The invention relates to the general field of integrated circuits, and more particularly to a high performance integrated circuit with low skew clocking networks and improved low power operating mode having reduced recovery time.

BACKGROUND

As minimum transistor geometries of today's integrated circuits continue to shrink below 100 nanometers, vastly more transistors are available to be placed within a given area on an integrated circuit, or "chip." This results in increasing power density within the chip. For example, the Intel 80386 microprocessor, circa 1988 contained hundreds of thousands of transistors and consumed tens of Watts of power, mainly due to normal switching operation of the transistors. Today, and by contrast, the Intel Pentium 4 microprocessor contains about 55 million transistors and consumes more than 80 Watts of power. Emerging technologies incorporate over 200 million transistors in a processor. Such large power dissipations are becoming increasingly problematic for many applications, such as battery operated systems (e.g., PDAs, laptop computers, cell phones) and for systems requiring Energy Star compliance (e.g., office laser printers). The nature of many of these low power applications is such that the system should perform computations very fast when called upon to do so but often sits idle with no work to do for extended periods of time. Historically, large complex chips such as microprocessors have only marginally addressed this issue, resulting in little difference in operating power when the microprocessor is idle versus when doing useful work. This is because the clock signals, which drive the storage elements (e.g., registers, latches) and dynamic logic of the chip remain active such that a comparable amount of charge is switched whether the chip is doing useful work or not. Such clock signals are generally created as outputs from a Phased Lock Loop (PLL) circuit. Such PLLs are advantageous for maintaining internal synchronization with an external clock reference circuit, and can perform clock multiplication such that the reference clock frequency is multiplied by the PLL to produce an internal clock signal having a switching frequency that of the reference clock multiplied by some programmable constant (e.g, 7.0, 7.5, 8.0, 8.5).

FIG. 1 depicts a phase-locked-loop (PLL) and clock distribution system according to the prior art. A phase frequency detector 102 provides up and down signals (collectively a comparison signal) to a charge pump 104, loop filter 106 and voltage controller oscillator (VCO) 108. The output signal is delivered through buffer element 110 to a pipe clock driver network 112 that delivers the clock to clocked elements 114 (e.g., registers). A feedback signal 152 is provided to a divider 116 to delay match 118 and back to the phase frequency detector 102, forming the main loop. The design provides a conventional PLL and the creation of clock signals for driving the pipeline at a relatively large-multiplied frequency clock signal and for driving the chip I/O at the same clock frequency as the reference clock, the latter being necessary to synchronize signals occurring at the input and output pins of the integrated circuit to the reference clock input signal. The PLL allows the separately generated clock domain signals to maintain alignment with the input clock reference according to a reference clock edge, rather than suffering delay through the clock input buffer and clock generation circuits, an advantage well appreciated by those skilled in the art. In one particular example of such an arrangement, a global clock network covers much of the chip, driven by a network of clock buffers receiving as input the output clock signal from the PLL. Delay match circuits such as Delay Match A 118 and Delay Match B 120 as shown in the figure are designed as a best effort to phase align (that is, minimize clock skew) among signals System Clock, Feedback Clock, and the clocked elements 114, 126. This arrangement is recognized by those skilled in the art as generally delivering a network of reasonably low-skew destination clocks signals (that is, final stage clock signals that drive registers, latches, dynamic logic, etc.). By reducing clock skew, the maximum frequency can be made larger, since differences in clock signals across the chip do not degrade the departure time from transmitting circuits or the allowable arrival time at receiving circuits. A limitation to the arrangement shown in FIG. 1 is that the Pipe Clock Driver Network 112 is quite large and complex, essentially covering the entire area of the chip. Mismatches in circuit and parasitic loading conditions among the branches in this network are inevitable, leading to substantial regional skew at the final clock signals which drive the clocked elements. This clock skew could limit the maximum operating frequency of the chip and even cause frequency-independent hold time failures if the skew becomes sufficiently large.

FIG. 2 depicts a phase-locked-loop and clock distribution system according to the prior art. In this figure, the charge pump, loop filter and VCO are combined in block 204 for brevity and may be referred to as a clock generator. A synchronizer 218 is placed into the PLL feedback path to match the delay through a synchronizer in the bus interface timing generator 212. Thus, clock signals delivered to the circuit elements 214, 226 are phase aligned with minimal clock skew to input reference system clock. Both clock signals s3clk, and p3clk (the latter derived from the global clock mesh), are used to generate the final feedback input signal to the synchronizer 218. This arrangement reduces overall clock skew throughout the network clocked elements as described in U.S. Pat. No. 6,292,061, Restle, Philip, et. al., A Clock Distribution Network for Microprocessors, IEEE Journal of Solid State Circuits, Vol. 36, #5, May 2001, p. 792, and Rusu, Stefan, The First IA-64 Microprocessor, IEEE Journal of Solid State Circuits, Vol. 35, #11, November 2000, p. 1539. With the arrangement in FIG. 2, it is no longer possible to defeat the pipeline clock network (e.g., for the purpose of achieving a low power mode of operation), without defeating the feedback loop to the Phase Frequency Detector (PFD) of the PLL. Attempts to defeat the clock network up to and including the global clock mesh to approach an ideal condition of minimal power consumption and minimal clock skew will result in unlocking the PLL. Consequently, a synchronized bus frequency clock signal cannot be maintained for the purpose of responding to an interrupting event so as to signal the end of the low power mode. Furthermore, if the low power mode is terminated, the PLL should be relocked before pipeline operation can resume. This relock sequence typically takes thousands to tens-of-thousands of bus clock cycles to accomplish, substantially adding to the exit time latency of the low power mode. For example, a system having a bus clock period of 10 nanoseconds (100 MHz frequency) could take ~10-100 microseconds to recover from standby mode.

What is needed is a PLL that permits the circuit elements to be put to sleep while also providing fast clock synchronization recovery.

SUMMARY

The invention is directed to a high performance integrated circuit with low skew clocking networks and improved low power operating mode having reduced recovery time. The invention includes a Phase Locked Loop (PLL) that permits the circuit elements to be put to sleep (i.e., in low-power mode), thus conserving power, while also providing fast clock synchronization recovery.

A low power feature is described for a microprocessor having a PLL that generates an internal pipeline clock synchronized to an input reference clock. The PLL multiplies the reference clock frequency by some number (e.g., 4.0 4.5, 5.0, . . . 7.5, 8.0 . . . ) such that the pipeline is clocked at a frequency considerably greater than the input reference frequency. Multiple clock domains exist within the chip, generated by the PLL. For example, a core, or pipeline clock is generated from the PLL which may have a clock frequency 8.0 times that of the reference clock. A memory sub-system, such as a cache memory, may operate from a PLL-generated clock signal operating at either the same frequency as the pipeline, or, say, one half that frequency (4.0). On the other hand, the I/O interface to the integrated circuit should continue to synchronize data into and out of the chip according to the input clock reference frequency and therefore should run at 1.0 times the input clock reference frequency. Because the pipeline, and memory sub-system often comprise most of the electrical circuitry on the chip, and because this circuitry is operating at a substantial multiple of the input clock reference frequency, most of the electrical power dissipation is in this circuitry. Whereas some applications require that this circuitry perform work sometimes while idling at other times, a method is discussed for substantially eliminating power dissipation to this circuitry while preserving the architectural state of the machine such that upon exit of the low power dissipation state the device can resume normal operation without re-initialization or reboot. The reduction in power is maximized by disabling the global clock network to the circuits. Entry into this low power standby mode is accomplished under software control and exited via an electrical event stimulus such as assertion of an interrupt or reset pin. Entry into and exit from this standby mode is made shorter by maintaining synchronization to the PLL even while the global clock signal of the chip, which otherwise feeds back into the PLL to maintain synchronization to the input reference clock, is defeated. Also, a portion of the integrated circuit's bus interface remains active for the purpose of receiving the interrupting event. Additional provisions are made for operating the pipeline, memory, and other circuits at a much reduced clock rate rather than with no clock functionality at all to avoid potential loss of state or electrical pre-charge condition within the die due to transistor and diode current leakage, a common concern in deep sub-micron devices.

DRAWINGS

The invention is described with reference to the following figures.

Figure 3A:
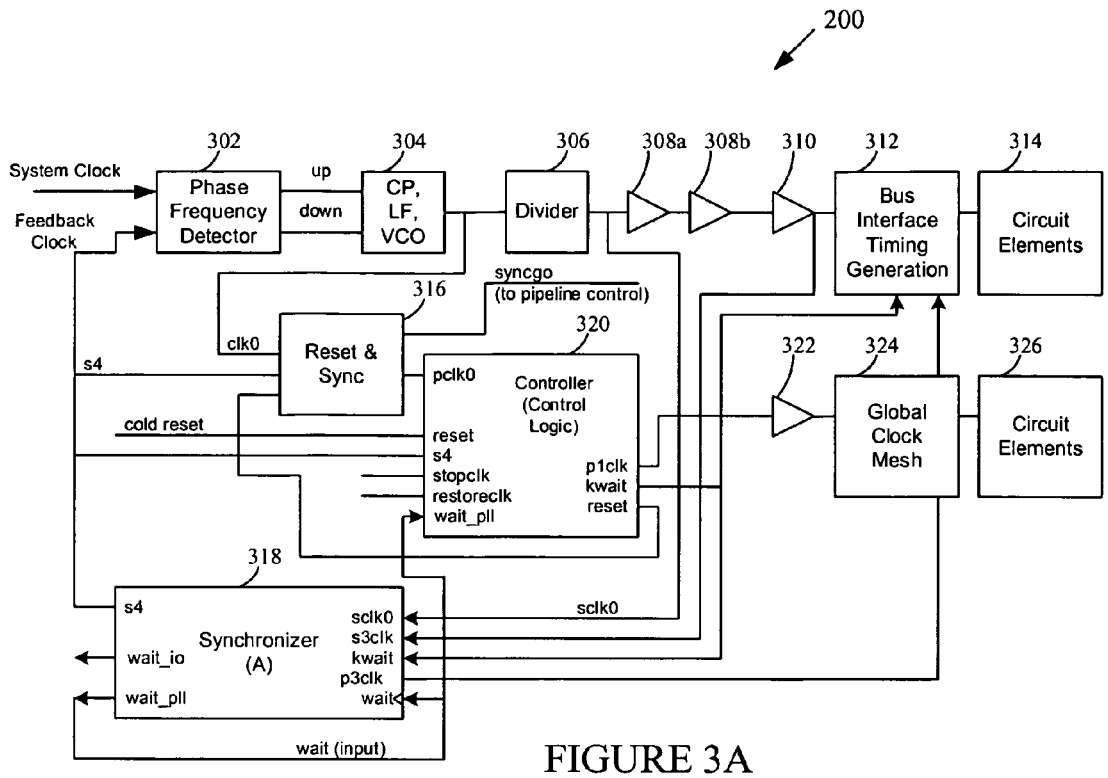
Figure 3B:
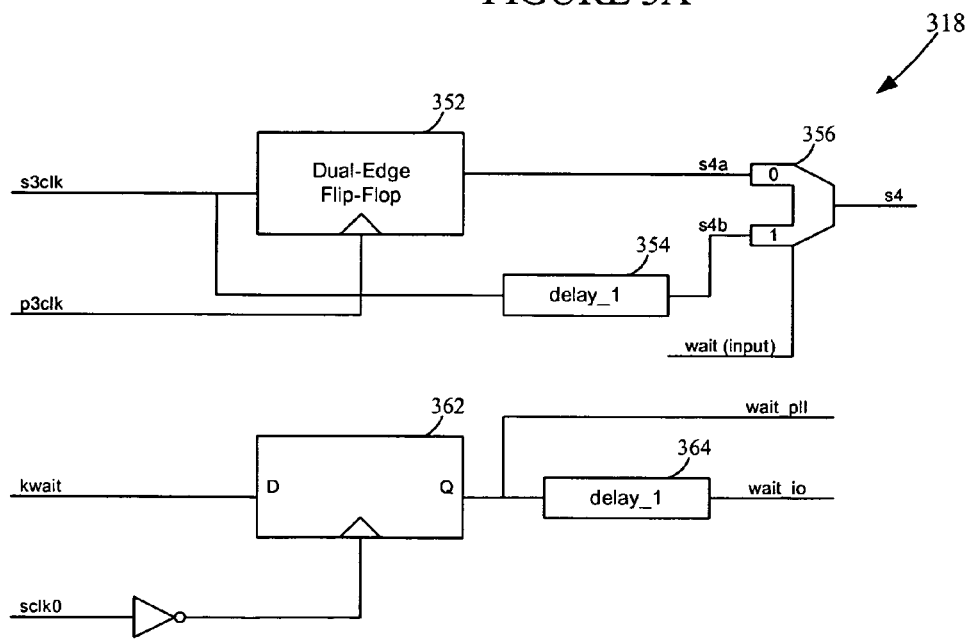
Figure 3C:
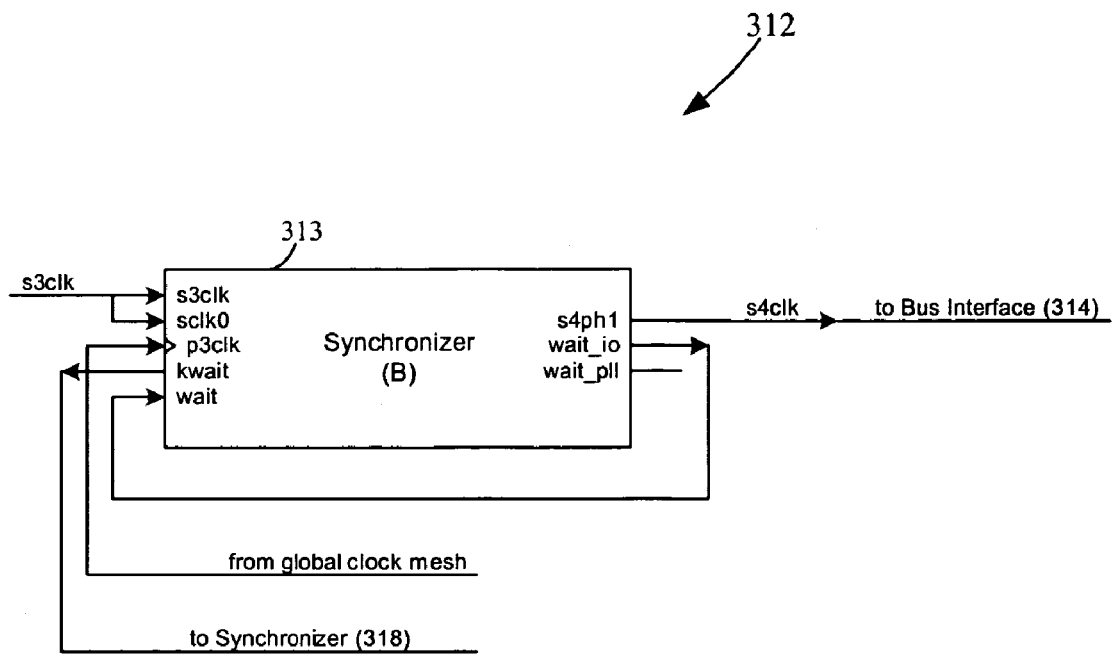

FIGS. 3A-C depict a phase-locked-loop and clock distribution system according to an embodiment of the invention.

Figure 4A:
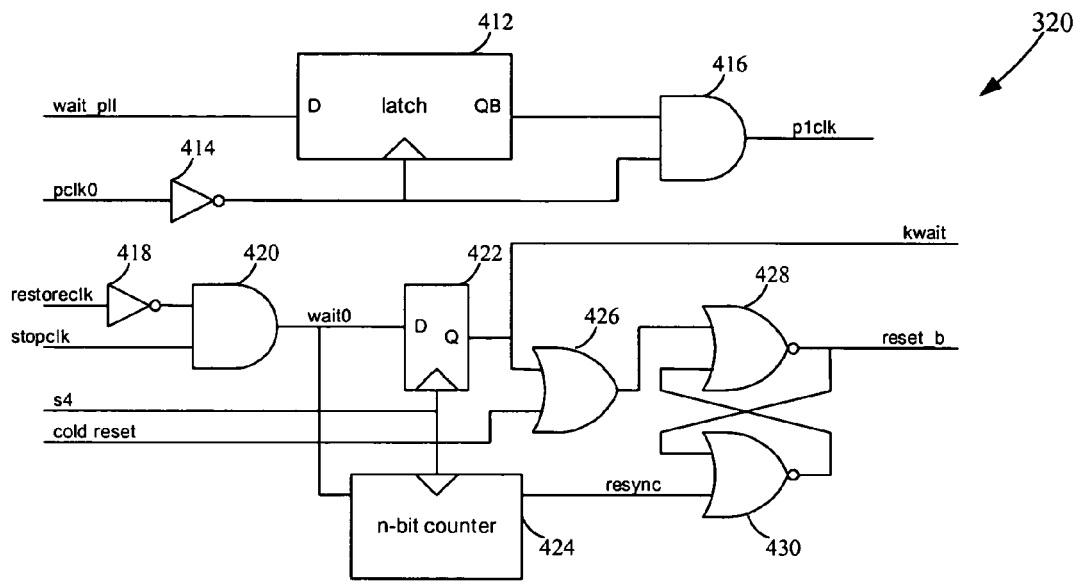
Figure 4B:
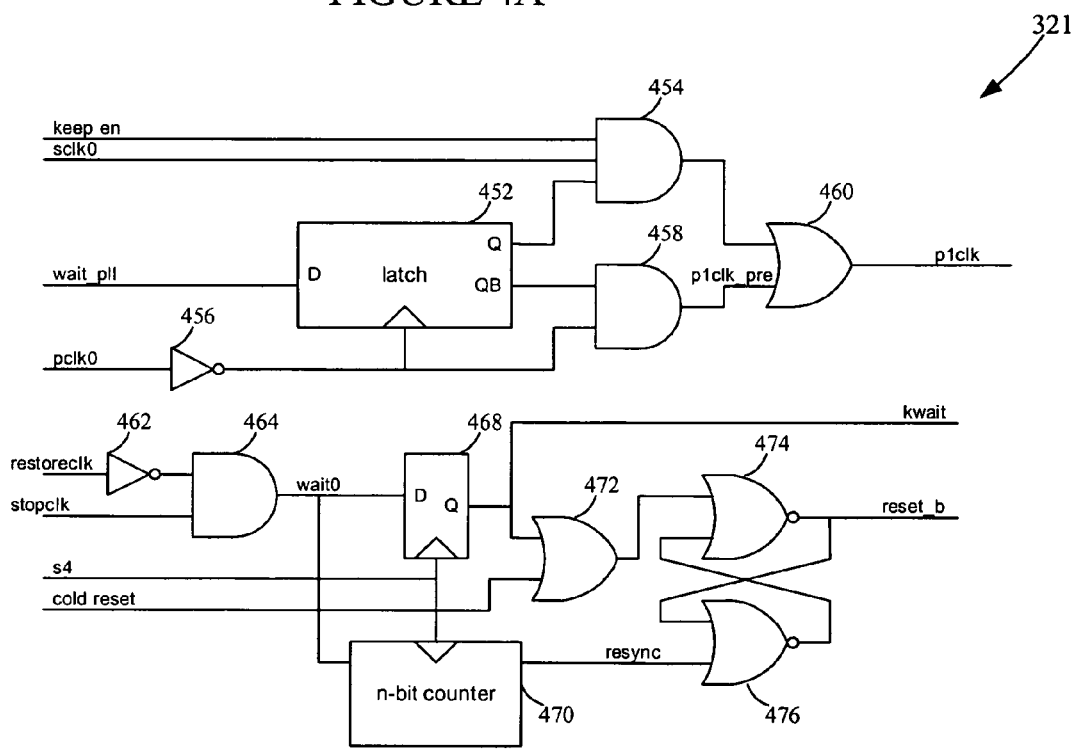

FIGS. 4A-B depict synchronizers according to an embodiments of the invention.

Figure 5:
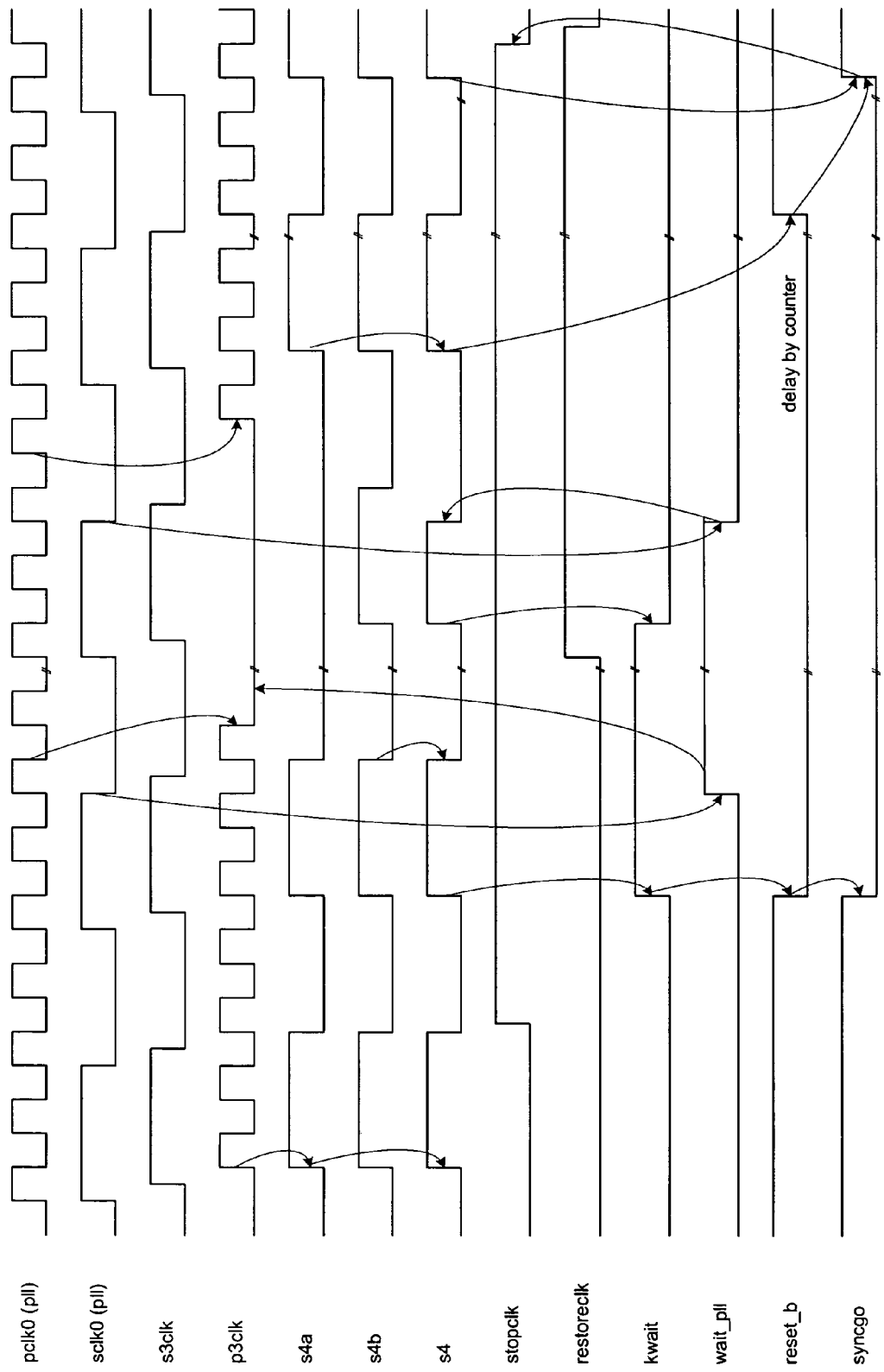

FIG. 5 is a timing diagram according to an embodiment of the invention.

Figure 6:
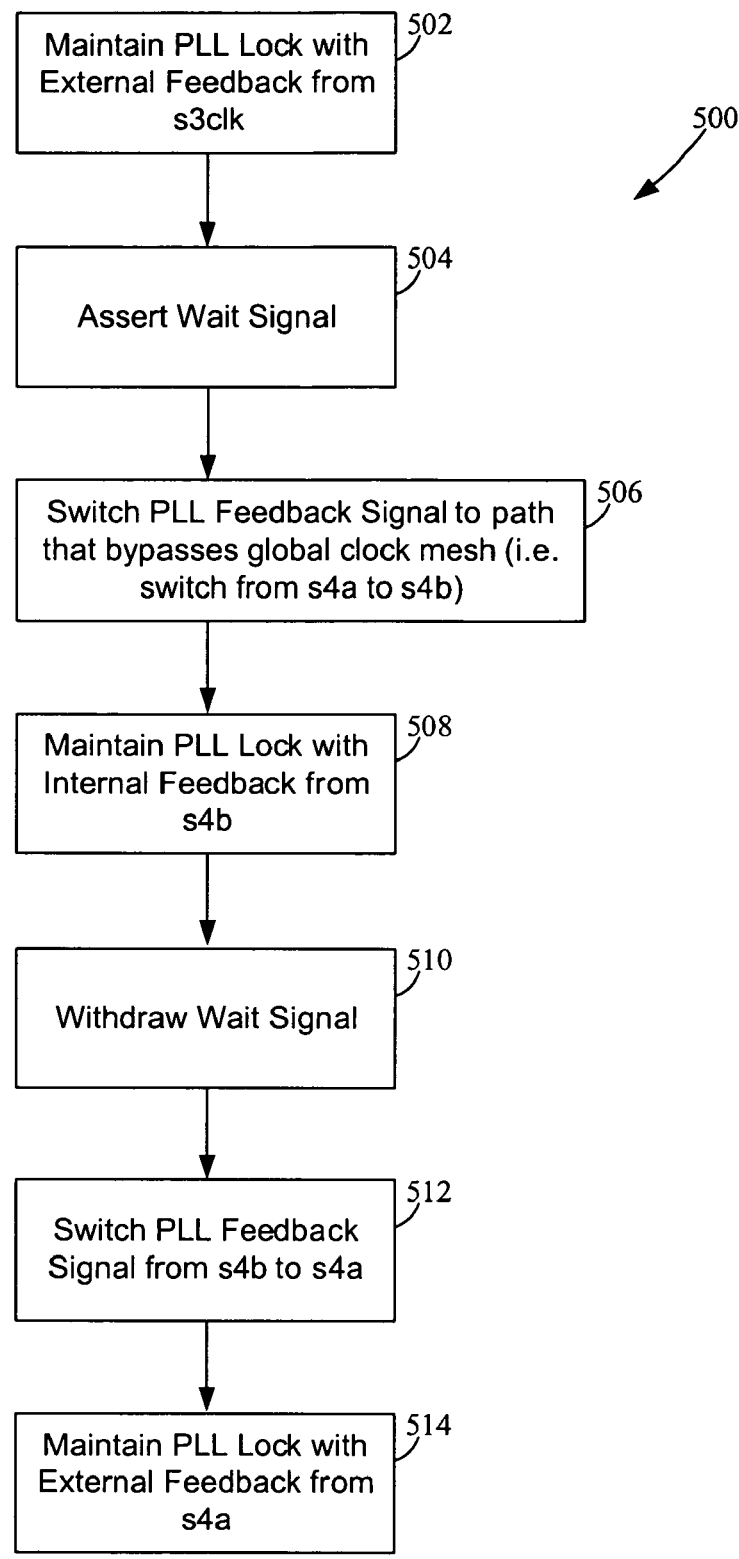

FIG. 6 is a flowchart showing steps for providing clock distribution according to an embodiment of the invention.

Figure 7:
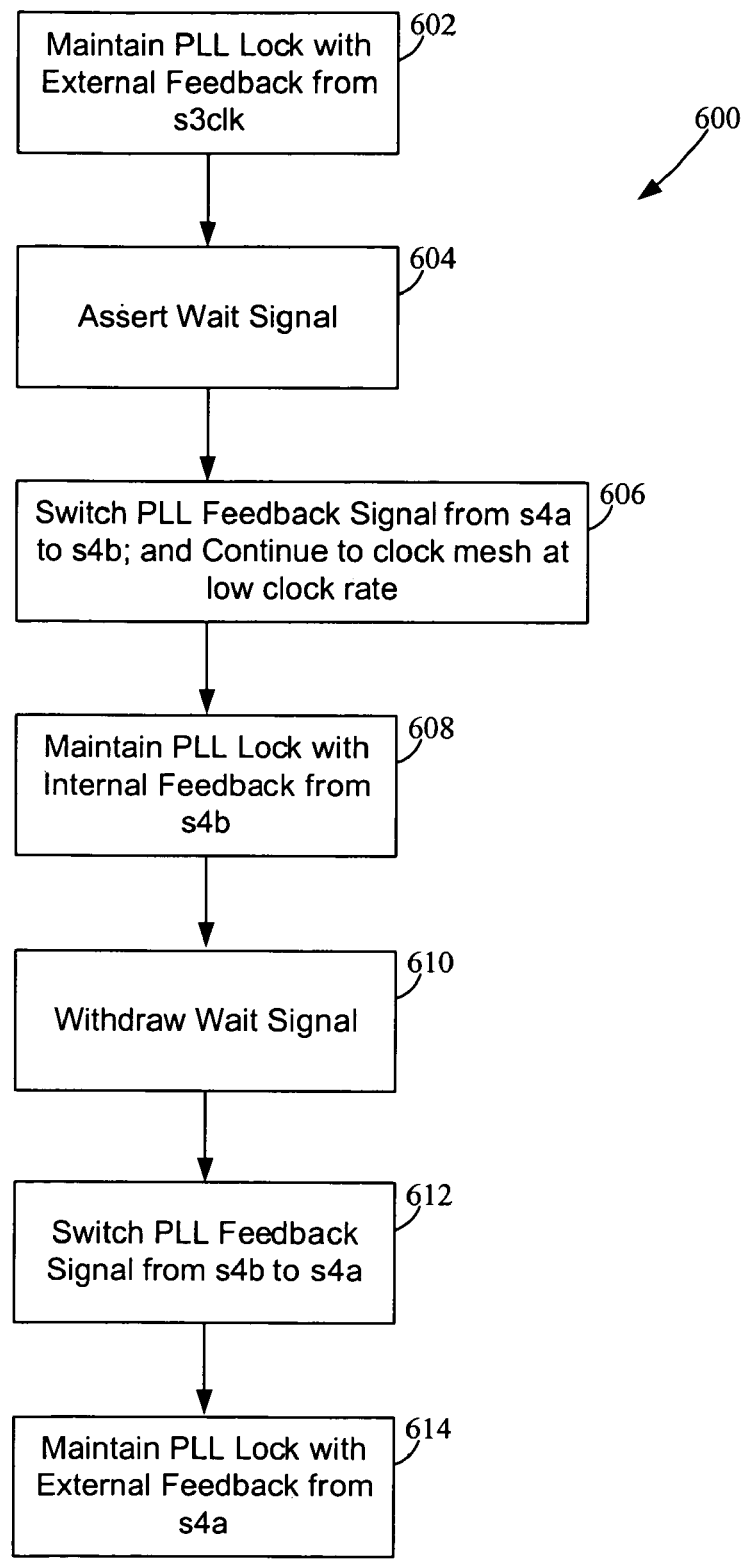

FIG. 7 is a flowchart showing steps for providing clock distribution according to an embodiment of the invention.

DETAILED DESCRIPTION

The invention is described with reference to specific apparatus and embodiments. Those skilled in the art will recognize that the description is for illustration and to provide the best mode of practicing the invention. Variations and modifications are anticipated and will be evident to those skilled in the art.

The present invention uniquely solves several limitations in conventional clock circuits. While it describes a means to preserve the global clock mesh into the PLL feedback path, thus reducing clock skew between clock domains and the reference clock signal, it offers further improvement in clock skew while providing a means for substantially defeating the pipeline clock network, including the global clock mesh, without defeating a synchronized bus interface clock signal and without unlocking the PLL. By eliminating the need to unlock the PLL, exit latency from a low power mode is dramatically reduced while the architectural state is preserved. The invention further describes a means for keeping a low frequency pipeline clock signal propagating during the low power state to mitigate potential negative effects of charge leakage that might cause dynamic circuits, for example, to discharge and the processor to lose state or otherwise fail to function properly while in the low power state. This is of particular concern in today's deep sub-micron CMOS transistor technologies.

Figure 1:
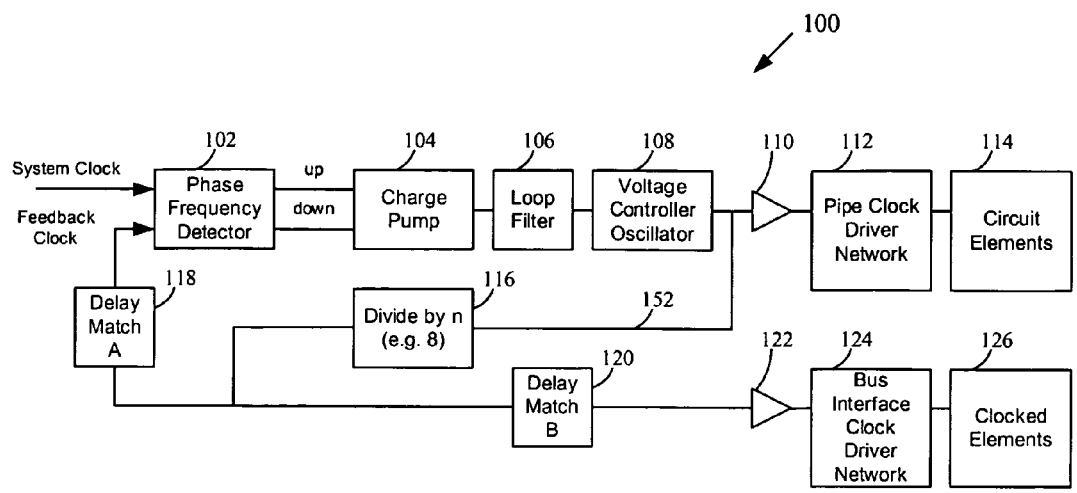
FIG. 1 depicts a phase-locked-loop and clock distribution system according to the prior art.
Figure 2:
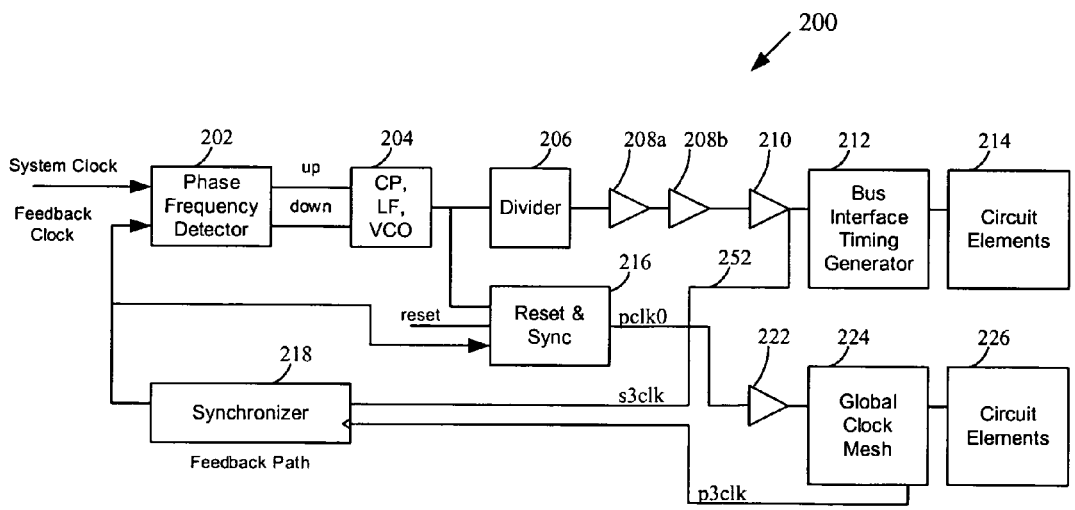
FIG. 2 depicts a phase-locked-loop and clock distribution system according to the prior art.

A first embodiment of the present invention is described beginning in FIG. 3A with reference to FIG. 2. The synchronizer circuit 318 is modified to accept control input signal kwait and early bus frequency clock signal s3clk, and modified also to generate output control signals wait_io and wait_pll as described below. Also, a Control Logic block 320 is added with control input terminals wait_pll (from the modified synchronizer 318), stopclk and restoreclk, and clock input terminals pclk0, and s4. The Control Logic 320 generates early phase pipeline clock signal p1clk, thus replacing pipeline clock signal pclk0 from FIG. 2 as input to the pipeline clock network. It also generates control signal kwait, which as mentioned earlier is input to the modified synchronizer. The details of the modified synchronizer circuit 318 are shown in FIG. 3B and are described below. The details of the bus interface and timing generation circuit 312 are shown in FIG. 3C and are described below.

The details of the Control Logic are shown in FIG. 4A. When a WAIT instruction is incurred in the program sequence, it signals to the processor to enter the low power state. Accordingly, the pipeline first completes processing of all instructions older than the WAIT instruction, after which the pipeline control logic signals to the system interface block that all instructions older than the WAIT instruction have completed and it is now safe to enter the low power mode. The system interface block then asserts signal stopclk. The signal restoreclk is in the de-asserted low state. This causes signal wait0 to go to a one logic level (high). Late phase bus clock frequency signal s4, which is output from PLL synchronizer 318 and is the signal that feeds back to the Phase Frequency Detector of the PLL, is used to register wait0 on the next rising edge of s4, thus asserting low power mode control signal kwait. This register arrangement provides adequate clock boundary synchronization of stopclk, which is created in the pipeline clock domain (e.g., p3clk), to the bus frequency domain signal kwait control signal with good phase alignment to reference clock input System Clock. Control signal kwait going high results in control signal reset_b being asserted low. reset_b signals to the Reset and Synchronization circuit 316 that instruction processing should be stopped and accordingly the Reset and Synchronization circuit 316 deasserts a control signal syncgo low, control signal kwait is output from the Control Logic 320 and input to both the bus interface circuit 312 (to synchronizer 313) and PLL circuit synchronizer 318. Registering kwait in the way described provides deterministic synchronization across the clock domains and works to swallow short pulses that may otherwise occur when switching between the normal mode of operation (and normal clocking) to the low power mode of operation (with modified clocking arrangement).

Note that while this embodiment demonstrates that the low power entry control signal kwait is asserted responsive to a WAIT program instruction, this should not be construed as limiting and other means for controlling the assertion of kwait are anticipated without loss of generality to the claims of this invention.

Now with reference to FIGS. 3A-B, the bus interface instantiation 312 of the modified synchronizer accepts as input from the Control Logic 320 low power mode control signal kwait. Control signal kwait is then registered on the next falling edge of bus frequency clock signal sclk0, creating undelayed wait signal wait_pll and delayed wait signal wait_io. (For bus interface synchronizer 312, bus frequency clock signal s3clk is connected to input port sclk0 since earlier phase bus frequency clock signal sclk0 is local to the PLL and generally not available in the bus interface circuit.). Note that delayed wait signal wait_io is delayed by delay circuit delay_1 364, as described below.

As further shown in FIGS. 3A and 3C, delayed wait signal wait_io is fed back to the wait input of synchronizer 313 within Bus Interface and Timing circuit 312 and provides a control input to the multiplexor within the synchronizer.

Signal s3clk is guaranteed to lead pipeline global clock mesh signal p3clk in phase by at least the required setup time of the dual edge-triggered flip-flop 352, maintaining proper synchronization.

The modified synchronizer 318 now has two electrical paths from its s3clk input to its s4 output. The primary, and original path goes through the dual edge-triggered flip-flop 352, generating intermediary signal s4a. Accordingly, in normal operating mode (wait is low), the synchronizer operates in a standard manner similar to that described with reference to FIG. 2.

The second (alternate) path goes around the dual edge-triggered flip-flop 352 and through delay circuit delay_1 354. Accordingly, when control input signal wait is asserted high, bus frequency clock signal s3clk is delayed by delay circuit delay_1, providing an identical delay as that separating wait_pll and wait_io and generating signal s4b. Delay_1 354 is designed to mimic the delay that is the sum of the expected set-up time of s3clk (relative to p3clk) and the clock-to-Q delay of the dual edge-triggered flip-flop, thus minimizing the phase shift of output clock signal s4 when changing from normal mode to low power mode. A second instantiation of delay_1 364 is used to generate wait_io, guaranteeing that multiplexor input signals s4a and s4b are stable when wait=wait_io is asserted and deasserted.

A similar arrangement can be found in the PLL instantiation 318 of the modified synchronizer circuit with two distinctions relative to bus frequency instantiation 312 of the modified synchronizer. First, the sclk0 input terminal of synchronizer 318 is connected to earlier phase bus frequency clock signal sclk0. Second, undelayed wait signal wait_pll, rather than delayed wait signal wait_io, is coupled to multiplexor control signal wait. The reason for this has to do with the timing of the wait_pll signal feeding back to the Control Logic described below. The relatively early phase generation of wait ensures that wait is stable when s4a and s4b change. In all other respects, modified synchronizer configuration 318 operates substantially similar to modified synchronizer configuration 312.

It is useful to note that the alternate feedback path does not go through the global clock mesh, so the global clock mesh can be disabled during low power mode while maintaining closed loop synchronization of the PLL (see synchronizer instantiation 318) and while maintaining a bus frequency clock signal at the bus interface aligned to reference clock input systemclk.

While the total delay through the alternate feedback path may not precisely match that of the primary feedback path that goes through the clock mesh and the local padring synchronizer, the delays can be made reasonably close (e.g., within 100 picoseconds). The small phase shift is not considered critical for low power operation. Specifically, assertion of the chip input interrupt signal, used to exit the standby mode, is "imprecise", meaning it is not critical from the system perspective to guarantee exactly which of, say, three adjacent bus clock cycles the assertion of the interrupting signal is registered to. It doesn't matter if the chip registers the interrupt, for the purpose of exiting the low power mode one cycle earlier or one cycle later than expected. On the other hand, the small phase shift is important for allowing a short recovery time when low power (sleep) mode is exited.

Again with reference to FIG. 4A, PLL synchronizer signal wait_pll is input to the Control Logic 320, where it is fed as input to latch 412. Latch 412 is in the transparent mode (that is input signal D is fed through to Q) when signal pclk0 is low. When the signal pclk0 at the clk terminal goes high and remains high, the input at D is latched and maintained at output Q irregardless of subsequent transitions at the D input. With reference to FIG. 3A, pclk0 is an early phase pipeline clock signal output from the Reset and Synchronization logic, whose primary clock input is clk0 taken directly from the output of the PLL. As already described, the Reset and Synchronization logic 316 serves mainly to synchronize specific pipeline clock cycles to associated bus interface clock cycles and to signal to the processor pipeline control logic that it is safe to begin fetching and processing instructions. This can be important during an exit from a device reset condition (e.g., cold reset) and, as described below, during exit from the low power mode. In both cases, the pipeline clock network should stabilize (restabilize) and synchronize to specific bus frequency clock phases. The need for providing undelayed wait signal wait_pll as input to the Control Logic now becomes apparent in view of the relatively early phase pipeline clock signal pclk0 being used as the clock input to the latch 412. Specifically wait_pll should be generated early enough so that the minimum set-up time of wait_pll relative to clock pclk0 at latch 412 is met. Accordingly, on the next falling edge of pclk0 after wait_pll is asserted, wait-controlled clock signal p1clk is defeated and remains low as long as wait_pll is asserted.

To exit low power mode, an interrupt signal input to the device is asserted. The interrupt signal is generated by a circuit external to the invention. This signal is registered by the bus interface unit, which is still being clocked by the bus frequency clock signals by way of Bus Interface Timing Generation Synchronizer 312 in FIG. 3A. Thereupon, control signal restoreclk is asserted. (Note that this embodiment describes an external interrupt event as being the means to control the assertion of restoreclk while in the low power mode. This should not be construed as limiting with regard to this invention. Other means of controlling the assertion of restoreclk can be made possible without loss of generality of the claims of this invention.)

With reference to FIG. 3B, on the next rising edge of PLL synchronizer output and PLL feedback clock signal s4, control signal kwait is de-asserted. On the next falling edge of sclk0, wait_pll is de-asserted, thus switching the multiplexor in the PLL synchronizer 218 to receive s4a (normal mode). When early phase pipeline clock signal pclk0 next goes low, the output of the latch in the Control Logic 320 returns high and controlled pipeline clock signal p1clk toggles with pclk0 indefinitely. Signal p1clk is input to the pipeline clock network so the global clock network resumes clocking and the global clock mesh is now synchronizing the s3clk signal through the PLL synchronizer via the dual edge-triggered flip-flop. However, the finite phase shift inevitably created in the synchronizer circuits when transitioning into low power mode should be reversed. That is, the PLL should cycle enough times to restore phase alignment between clock domains and the reference clock input System Clock before normal operation can resume, or else synchronization errors could occur.

To provide a means to precisely control the time given to the PLL to regain phase alignment after returning to normal mode, a programmable counter is included to control the number of bus clock cycles reserved to resynchronize the PLL before control is passed back to normal operation of the pipeline (that is, before instruction processing is allowed to resume). An n-bit counter 424 is shown in FIG. 4A. When control signal wait0 is deasserted, the n-bit counter starts counting and increments with every bus clock cycle s4. When the counter reaches its maximum value and then overflows, the resync signal is asserted high. Cross coupled NOR gates 428 and 430 operate as an asynchronous Set-Reset flip-flop. When resync is asserted after kwait is de-asserted (coldreset is low), active low reset signal reset_b is de-asserted high. Reset signal reset_b is input to the Reset and Synchronization Logic 316, which subsequently asserts signal syncgo, which signals to the pipeline control logic (not shown) that PLL operation is stable, that the phase shift has been reversed, and that normal instruction processing can resume.

Because the phase shift is kept small by the operation of the alternate path in the synchronizer circuits, the number of cycles can be made relatively small (e.g., 256 cycles) and therefore the number of bits in the counter can be kept small (e.g., 8). Thus, the invention enables a low-skew clock synchronization system having a low power mode characterized by reduced entry and recovery time while preserving a clocking architecture known to achieve improved total clock skew.

The detailed timing showing entry into and exit out of the low power mode state is illustrated in FIG. 5 (and in Prov. No. 60/630,527 incorporated herein by reference), assuming a pipeline to bus clock frequency divide ratio of 4:1. To summarize, the salient events in the sequence are as follows:

1. Frequency multiplied Pipeline clock signals pclk0 and p3clk and Bus Interface clock signals sclk0 are assumed operating normally prior to entry into the low power mode. Consequently, signal s4a inside the synchronizers is active.
2. stopclk signal is asserted responsive to a WAIT instruction incurred in the program sequence. stopclk is asserted after all instructions older than the WAIT instruction have been completed.
3. On the next rising edge of PLL synchronizer output clock signal s4, signal kwait is asserted high. reset_b is asserted, causing signal syncgo to be de-asserted low, signaling the pipeline that clocking is changing over to the low power mode, that the pipeline clock will no longer be synchronized to the bus frequency clock or the system reference clock, and that instruction processing should remain halted.
4. On the next falling edge of sclk0, wait_pll is asserted.
5. On the next falling edge of early pipeline clock signal pclk0, global clock mesh signal p3clk is halted and remains in the low state. Consequently, signal s4a inside the clock synchronizer is halted low, and synchronizer output signal s4 becomes responsive to s4b instead of s4a, thus maintaining a bus frequency clock signal to the bus interface and further maintaining an active feedback path to the PLL. Due to the delay matching in the synchronizer, minimal phase shift in s4 occurs. The chip is now in the low power mode.
6. After some time, signal restoreclk is asserted, responsive to an interrupt signaling event at the device pins, for example. Assertion of restoreclk also enables the n-bit counter to begin counting, responsive to rising transitions of PLL synchronizer output clock signal s4.
7. On the next rising edge of PLL synchronizer output clock signal s4, kwait is de-asserted low. The n-bit counter increments from zero.
8. On the next falling edge of early bus frequency clock signal sclk0, wait_pll is de-asserted low. The synchronizer output clock signals become once again responsive to s4a via the p3clk-clocked (global clock mesh clocked) dual edge-triggered flip-flop.
9. The pipeline clock network, including global clock mesh clock p3clk, resumes toggling, albeit with some phase shift inherited from the standby mode of operation. reset_b remains asserted low and syncgo remains de-asserted low. The counter continues to increment with each s4 rising edge.
10. The counter eventually overflows, asserting resync. This causes reset_b to be de-asserted high, further causing the Reset and Synchronization logic to assert syncgo, signaling to the pipeline control logic that it is safe to resume instruction fetching and processing.

It is useful to note that the synchronization described in steps 3 through 5 above are prescribed to gracefully sequence the chip into and out of low power state, avoiding degraded or otherwise mis-timed clock pulses during the critical transition periods, and are shown by way of example. This example should not be construed as limiting as other means to avoid such degraded clock pulses are possible without loss of generality to the invention.

In a second embodiment of the present invention, the Control Logic 320 is further modified to provide a means for keeping the pipeline clock network, including the global clock mesh, operating at some substantially reduced clock frequency relative to normal operation. The modified arrangement is shown in FIG. 4B. Early bus frequency clock signal sclk0 is input to the modified Control Logic and to AND gate 454 along with control signal keep_en and the latched output of control signal wait_pll. Control signal keep_en selects whether the pipeline clock is defeated in low power mode or else toggles at a reduced clock frequency (in this case, the bus clock frequency). OR gate 460 receives as input pipeline clock signal p1clk_pre, which is logically equivalent to output pipeline clock signal p1clk in FIG. 4A, and the output of AND gate 454. When the low power mode is not active or pending, control signal wait_pll remains low while clock signal pclk0 toggles. Thus, the Q output of latch 452 remains low and the complement output QB of the latch 452 remains high. Consequently, the output of OR gate 460 follows pclk0. When low power mode is active or pending, signal wait_pll goes high, and, because pclk0 is constantly toggling, the Q output of latch 452 will eventually go high while the complement output QB of latch 452 goes low. This is similar to the arrangement discussed in FIG. 4A. If keep_en is low, the option to defeat the pipeline clock signal is selected. Accordingly, the output of both AND gates 454 and 458 are low and therefore output signal p1clk is low for the duration of the low power mode. Conversely, if keep_en is high, then p1clk follows reduced frequency (in this case bus frequency) clock signal sclk0 for the duration of low power mode, thus reducing power dissipation linearly according to the well known expression:

Power=$CV^2f$

Where

C=total capacitance switched

V=supply voltage or voltage switched f=clock frequency

Note that keep_en can be generated during device initialization or dynamically by way of a control register load sequence, or by any other practical means. Therefore, the means of controlling keep_en should not be construed as limiting with regard to the claims of this invention.

Such an arrangement depicted in FIG. 4B, while dissipating more power in low power mode than when the pipeline clock is halted, protects against potential loss of internal state or electrical precharge conditions caused by charge leakage phenomena commonly associated with deep-sub-micron CMOS transistors. The current embodiment shows an arrangement whereby the bus clock frequency is fed through to the pipeline clock network, however this is intended to illustrate a specific example and should not be construed as limiting. A clock signal having any divided frequency relative to the normal pipeline clock could be generated and synchronized to the pipeline clock network using the provisions demonstrated in this invention without loss of generality of the claims of this invention.

FIG. 6 is a flowchart showing steps for providing clock distribution according to an embodiment of the invention. In step 502, the circuit maintains PLL lock with external feedback from s3clk and, by way of the clock mesh or similar network, p3clk, allowing signal s4a to propogate to feedback clock signal s4. In step 504, a wait signal is asserted. In step 506, the circuit switches PLL feedback signal from s4a to s4b. In step 508, the circuit maintains PLL lock with internal feedback from s4b. In step 510, the wait signal is withdrawn. In step 512, the circuit switches PLL feedback signal from s4b to s4a. In step 514, the circuit maintains PLL lock with external feedback from s4a.

FIG. 7 is a flowchart showing steps for providing clock distribution according to an embodiment of the invention. In step 602, the circuit maintains PLL lock with external feedback from s4a. In step 604, a wait signal is asserted. In step 606, the circuit switches PLL feedback signal from s4a to s4b, and continues the clock mesh at a low clock rate. In step 608, the circuit maintains PLL lock with internal feedback from s4b. In step 610, the wait signal is withdrawn. In step 612, the circuit switches PLL feedback signal from s4b to s4a. In step 614, the circuit maintains PLL lock with external feedback from s4a.

Numerous advantages of the invention have been described herein including the ability to operate the integrated circuit in a sleep state with a slow clock rate and then quickly recover to an operational clock rate.

Having disclosed exemplary embodiments and the best mode, modifications and variations may be made to the disclosed embodiments while remaining within the subject and spirit of the invention as defined by the following claims.

The invention claimed is:

1. An integrated circuit including a phase-locked-loop with fast clock synchronization recovery comprising:
   a phase frequency detector adapted to receive a system clock signal and a feedback clock signal and configured to generate a comparison signal;
   a clock generator coupled to the phase frequency detector and configured to generate a first clock signal based on the comparison signal;
   a controller coupled to the clock generator and configured to deliver a mesh clock signal to a global clock mesh; and
   a synchronizer coupled to the controller and adapted to receive an internal clock signal and a return clock signal from the clock mesh, and configured to selectively generate the feedback clock signal to the phase frequency detector based on one of the internal clock signal and the return clock signal.

2. The integrated circuit of claim 1, wherein:
   the synchronizer is configured to generate the feedback clock signal based on the internal clock signal in a first mode of operation and to generate the feedback clock signal based on the return clock signal in a second mode of operation.

3. The integrated circuit of claim 2, wherein the first mode is a low-power mode and the second mode is a standard-power mode.

4. The integrated circuit of claim 1, further comprising:
   a reset and synchronization circuit interposed between the clock generator and the control logic.

5. The integrated circuit of claim 1, further comprising:
   a divider coupled to the clock generator and configured to generate a bus clock signal based on a predetermined divisor, and to provide the bus clock signal to a bus interface and timing circuit and to the synchronizer as the internal clock signal.

6. The integrated circuit of claim 5, further comprising:
   a delay circuit interposed between the divider and the bus interface and timing circuit.

7. The integrated circuit of claim 5, wherein:
   the synchronizer includes an input adapted to receive the bus clock signal, a flip-flop coupled to the bus clock input and clocked by the mesh clock signal, a delay element coupled to the bus clock signal, and a multiplexer coupled to the flip-flop output and the delay elements and selected by a wait signal input.

8. The integrated circuit of claim 1, comprising two modes wherein the first mode provides a first feedback path and a second mode wherein the second mode provides a second feedback path, and wherein the controller is configured to select one of the first mode and the second mode.

9. The integrated circuit of claim 8, wherein the first mode is a standard-power mode and the second mode is a low-power mode.

10. The integrated circuit of claim 9, wherein the integrated circuit provides a fast clock synchronization recovery from the second mode to the first mode.

11. A method of clocking an integrated circuit using a phase-locked-loop with fast clock synchronization recovery comprising:

receiving a system clock signal and a feedback clock signal and generating a comparison signal;

generating a first clock signal based on the comparison signal;

delivering a mesh clock signal to a global clock mesh; and selectively generating the feedback clock signal based on either an internal clock signal or a return clock signal from the global clock mesh.

12. The method of claim 11, wherein:

in a first mode of operation, generating the feedback clock signal based on the internal clock signal; and in a second mode of operation, generating the feedback clock signal based on the return clock signal.

13. The method of claim 12, wherein the first mode is a low-power mode and the second mode is a standard-power mode.

14. An integrated circuit including a phase-locked-loop with fast clock synchronization recovery comprising:

a phase locked loop (PLL) having as output a multitude of clock signals with different frequencies whereby one or more of the clock signals is buffered through one or more stages to create one or more global clock meshes with distributed drivers, the PLL including a phase detector first stage having as input both a reference clock input and a first feedback path input for the purpose of maintaining phase and frequency locking between the reference clock input and the first feedback path input;

wherein the first feedback path passing through the global clock mesh such that the clock mesh directly or indirectly through one or more clock buffer stages supplies clocking signals to the eventual clocked computational elements (e.g., registers, latches, clocked dynamic logic);

the integrated circuit having a reduced power consumption state whereby the global clock mesh is disabled, thus disabling operation to the computational elements but also having the property that the architectural and electrical state of the integrated circuit (e.g., register contents, memory contents, and circuit precharge conditions) is substantially maintained for eventual exit from the reduced power consumption state;

a second feedback path from an output of the PLL that does not pass through the global clock mesh, used to maintain relative synchronization of the PLL when the first feedback path is disabled during the reduced power consumption state; and a first control means to switch between the reduced power state and a normal state of operation by enabling either the first feedback path (normal state), thus enabling the computational elements and power dissipation thereof, or the second feedback path (reduced power state), thus disabling the global clock mesh and the computational elements and power dissipation thereof, the second feedback path substantially maintaining synchronization to a reference clock and thereby achieving a reduced recovery time when switching from the reduced power state to the normal state such that the normal operation can be resumed sooner.

15. The integrated circuit of claim 14, wherein:

the first and second feedback paths include a synchronizer circuit in close proximity to a chip I/O interface, the synchronizer circuit comprising a means for generating a synchronized bus clock signal with substantially the same phase and frequency as the input reference clock for the purpose of synchronizing information into and out of the integrated circuit, the synchronizer circuit having a first path through a flip-flop element clocked by the global clock net and a second path around the flip-flop element for the purpose of maintaining synchronization to the PLL during a reduced power state whereby the global clock mesh is disabled, the first or second path selectable by the first control means, thus achieving improved synchronization (e.g., reduced clock skew) between a first clock signal domain represented by the global clock mesh, a second clock domain represented by the bus clock, and the reference clock.

16. The integrated circuit of claim 14, whereby entry into the reduced power state is accomplished under software control.

17. The integrated circuit of claim 14, whereby exit from the reduced power state is initiated by assertion of a control signal input to the integrated circuit, whereby clocking is maintained in the bus control unit during the reduced power state for the purposes of recognizing and processing assertion of the control signal.

18. The integrated circuit of claim 14, having means of selecting either no clock activity or a clock activity of some reduced frequency (example, equal to or less than that of the reference clock) for the purpose of reducing power dissipation while further protecting the electrical state of the computational elements indefinitely, even as current leakage on various electrical nodes could otherwise cause the electrical state to be lost.

* * * * *